US012807477B2

(12) United States Patent
Yen et al.

(10) Patent No.: US 12,807,477 B2
(45) Date of Patent: Nov. 24, 2026

(54) MICROELECTROMECHANICAL SYSTEM (MEMS) DEVICE WITH BACKSIDE PINHOLE RELEASE AND RE-SEAL

(71) Applicant: TEXAS INSTRUMENTS INCORPORATED, Dallas, TX (US)

(72) Inventors: Ting-Ta Yen, San Jose, CA (US); Jeronimo Segovia-Fernandez, San Jose, CA (US); Bichoy Bahr, Allen, TX (US); Benjamin Cook, Los Gatos, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 502 days.

(21) Appl. No.: 17/135,305

(22) Filed: Dec. 28, 2020

(65) Prior Publication Data

US 2021/0214212 A1 Jul. 15, 2021

Related U.S. Application Data

(60) Provisional application No. 62/958,853, filed on Jan. 9, 2020.

(51) Int. Cl.
*B81B 3/00* (2006.01)
*B81C 1/00* (2006.01)

(52) U.S. Cl.
CPC ........ *B81B 3/0072* (2013.01); *B81C 1/00666* (2013.01); *B81B 2201/0271* (2013.01); *B81B 2203/0353* (2013.01); *B81C 1/00476* (2013.01)

(58) Field of Classification Search
CPC ...... B81B 7/0045–0058; B81B 3/0072; B81B 2203/0353; B81C 1/00666; B81C 1/00476
See application file for complete search history.

(56) References Cited

U.S. PATENT DOCUMENTS

2008/0122020 A1* 5/2008 Metz ........................ H01L 21/56 438/51
2008/0279498 A1 11/2008 Sampsell et al.
(Continued)

FOREIGN PATENT DOCUMENTS

CN 103964376 A 8/2014
WO WO-2018162188 A1 * 9/2018 ........... B81B 7/0048

OTHER PUBLICATIONS

Machine translation of WO-2018162188-A1 (Year: 2018).*
(Continued)

*Primary Examiner* — Steven B Gauthier
*Assistant Examiner* — Sun Mi Kim King
(74) *Attorney, Agent, or Firm* — Zhenhai Fu; Charles F. Koch

(57) ABSTRACT

A device includes a substrate having first and second layers and an insulator layer between the first and second layers. A microelectromechanical system (MEMS) structure is provide on a portion of the second layer. A trench is formed in the second layer and around at least a part of a periphery of the portion of the second layer. An undercut is formed in the insulator layer and adjacent to the portion of the second layer. The undercut separates the portion of the second layer from the first layer. First and second pinholes extend from a plane of the insulator layer and in the first layer. The first and second pinholes are in fluid communication with the undercut and the trench.

22 Claims, 5 Drawing Sheets

(56) References Cited

U.S. PATENT DOCUMENTS

| | | | | |
|---|---|---|---|---|
| 2013/0105921 | A1 | 5/2013 | Najafi et al. | |
| 2014/0054728 | A1* | 2/2014 | Maling | B81C 1/00825 716/100 |
| 2016/0272482 | A1* | 9/2016 | Dawson | B81B 7/0048 |
| 2016/0297673 | A1* | 10/2016 | Lagouge | G01P 15/0802 |
| 2017/0267518 | A1* | 9/2017 | Kinugawa | B81C 1/00182 |
| 2018/0237290 | A1* | 8/2018 | Haug | B81B 7/0016 |
| 2019/0055121 | A1 | 2/2019 | Partridge et al. | |
| 2019/0207581 | A1* | 7/2019 | Yen | H03H 9/09 |
| 2019/0301956 | A1* | 10/2019 | Tanaka | H04R 31/003 |

OTHER PUBLICATIONS

Search Report for PCT Patent Application No. PCT/US2021/012880, date of mailing of the international search report Apr. 29, 1 page.

CN103964376a, English Machine Translation, 24 pages.

* cited by examiner

MICROELECTROMECHANICAL SYSTEM (MEMS) DEVICE WITH BACKSIDE PINHOLE RELEASE AND RE-SEAL

CROSS-REFERENCE TO RELATED APPLICATIONS

This application claims priority to U.S. Provisional Application No. 62/958,853, filed on Jan. 9, 2020, which is hereby incorporated by reference.

BACKGROUND

Microelectromechanical system (MEMS) devices are useful in a wide range of applications, e.g., sensors or actuators. MEMS devices may be fabricated on a substrate. MEMS devices are sensitive to vertical and lateral stress, such as package-induced stress, and may be affected by heat transmitted from the substrate.

SUMMARY

In one example, a device includes a substrate having first and second layers and an insulator layer between the first and second layers. A microelectromechanical system (MEMS) structure is provided on a portion of the second layer. A trench is formed in the second layer and around at least a part of a periphery of the portion of the second layer. An undercut is formed in the insulator layer and adjacent to the portion of the second layer. The undercut separates the portion of the second layer from the first layer. First and second pinholes extend from a plane of the insulator layer and in the first layer. The first and second pinholes are in fluid communication with the undercut and the trench.

DETAILED DESCRIPTION

The described examples include a device having stress and thermal isolation for a microelectromechanical system (MEMS) structure and a method for forming the device. In one example, stress and thermal isolation of the MEMS structure in the device is implemented by using backside pinhole release and re-seal on a silicon-on-insulator (SOI) substrate. The MEMS structure may include, for example, a bulk acoustic wave (BAW) resonator.

Figure 1:
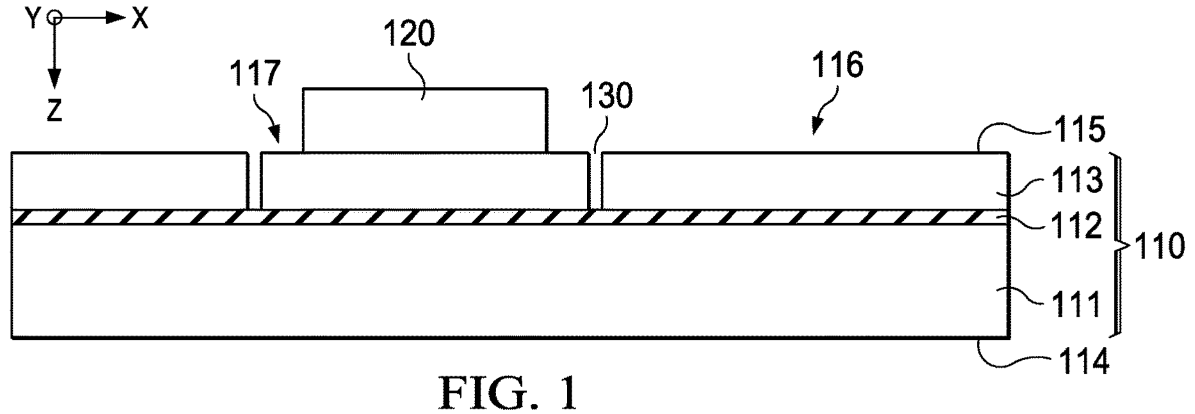
FIG. 1 illustrates a cross-sectional view of structures at an example stage of forming a device having stress and thermal isolation for a microelectromechanical system (MEMS) structure according to described examples.
Figure 8:
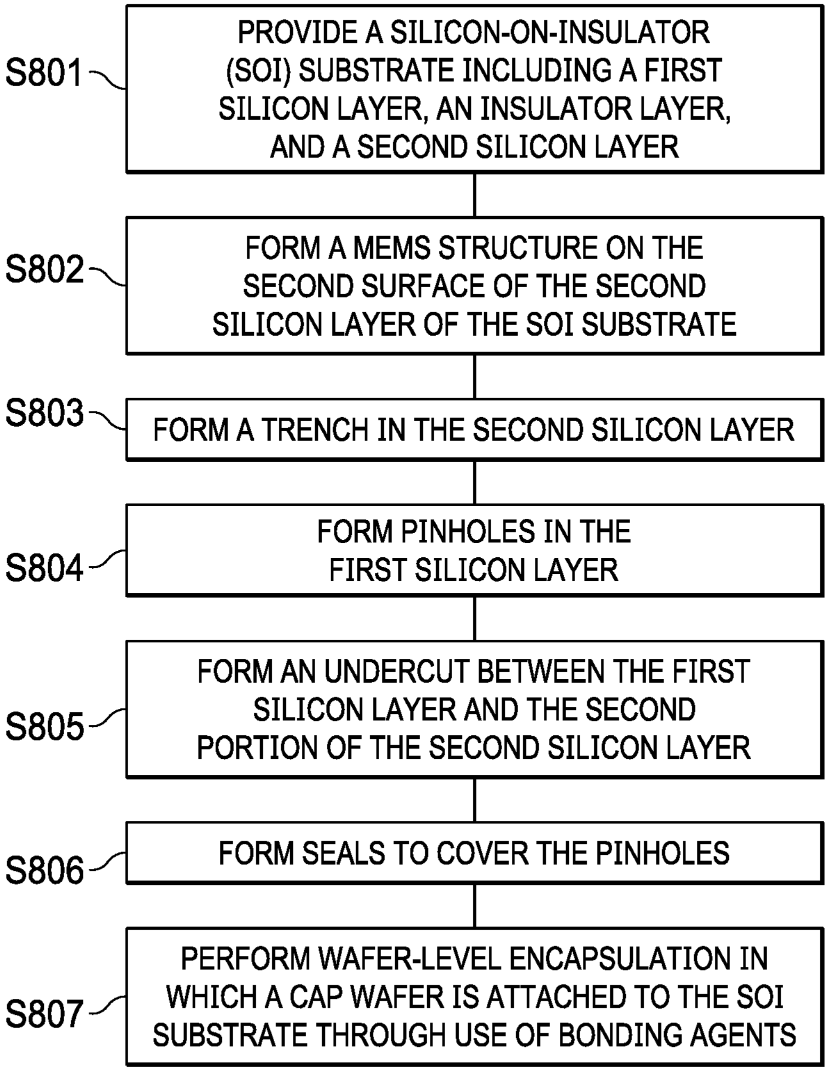
FIG. 8 illustrates a method for forming a device having stress and thermal isolation for a MEMS structure according to described examples.

Referring to FIGS. 1 and 8, the formation method includes providing an SOI substrate 110 (S801 in FIG. 8). The SOI substrate 110 includes a first silicon layer 111, an insulator layer 112 on the first silicon layer 111, and a second silicon layer 113 on an opposing surface of the insulator layer 112. Accordingly, the insulator layer 112 separates the first silicon layer 111 from the second silicon layer 113. A material of the insulator layer 112 may include, for example, silicon dioxide. The SOI substrate 110 includes a first surface 114 and an opposing second surface 115. The first surface 114 is a surface of the first silicon layer 111 opposite the surface of the first silicon layer 111 on which the insulator layer 112 is provided. The second surface 115 is a surface of the second silicon layer 113 opposite the surface of the second silicon layer 113 to which the insulator layer 112 is provided. FIG. 1 also illustrates a coordinate system comprising X, Y, and Z. The X-axis and the Y-axis are orthogonal to each other and are parallel to a plane of the SOI substrate 110, such as the first surface 114, the second surface 115, or the insulator layer 112. The X and Y-axes are thus referred to as "in-plane direction." The Z-axis is perpendicular to the X and Y-axes and thus perpendicular to a plane of the SOI substrate 110. Accordingly, the Z-axis is referred to as an "out-of-plane direction."

Figure 2:
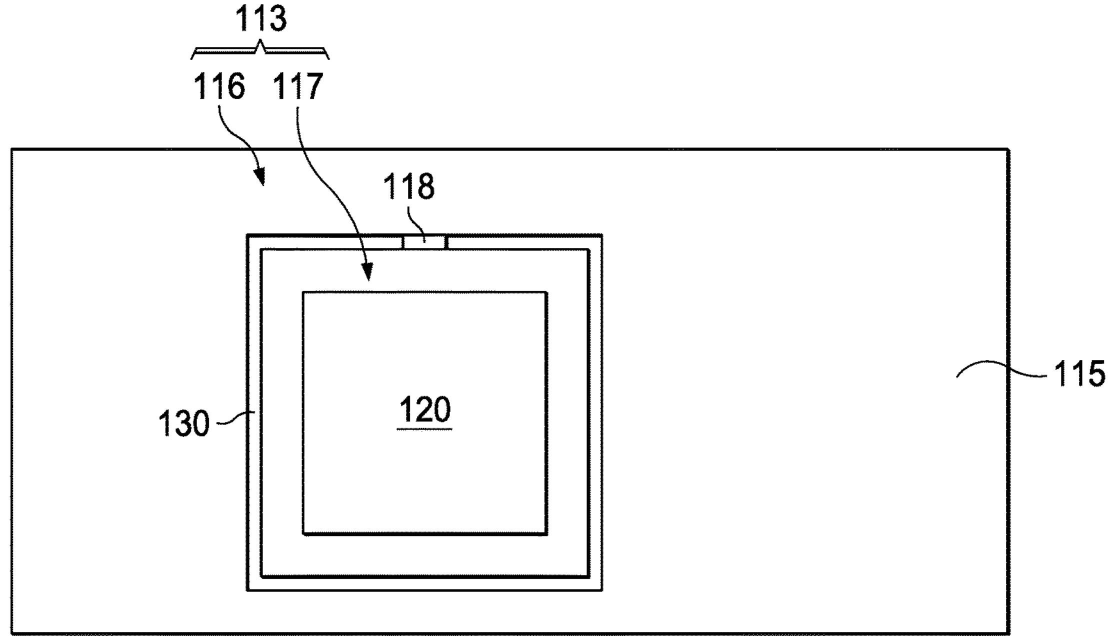
FIG. 2 illustrates a plan view of structures of FIG. 1 at an example stage of forming a device having stress and thermal isolation for a MEMS structure according to described examples.

FIG. 2 is a top view of FIG. 1. Referring to FIGS. 1 and 2, the formation method further includes forming a MEMS structure 120 on the second surface 115 of the second silicon layer 113 (S802 in FIG. 8) and forming a trench 130 in the second silicon layer 113 (S803 in FIG. 8). The trench 130 may be formed by patterning and etching to remove silicon in the second silicon layer 113. The trench 130 may partially separate a first portion 116 of the second silicon layer 113 from a second portion 117 of the second silicon layer 113. The first portion 116 and the second portion 117 are connected to each other via a connecting structure 118. In one example, the connecting structure 118 is a bridge that comprises a thin portion of the silicon layer between the first portion 116 and the second portion 117. In another example, the connecting structure 118 is a tether which has more complicated structures for stress and thermal isolation. One example of a tether is a spring. A tether may have various flexibilities, from being relatively inflexible with a higher spring constant or being more flexible with a lower spring constant. The tether may have a first end coupled to one of the first and second portions 116 and 117 and a second end coupled to the other of the first and second portions 116 and 117. The location of the connecting structure 118 may be chosen according to various application scenarios, such as at one or more sides of the second portion 117, and/or one or more corners of the second portion 117, and/or at any other suitable locations.

Figure 9:
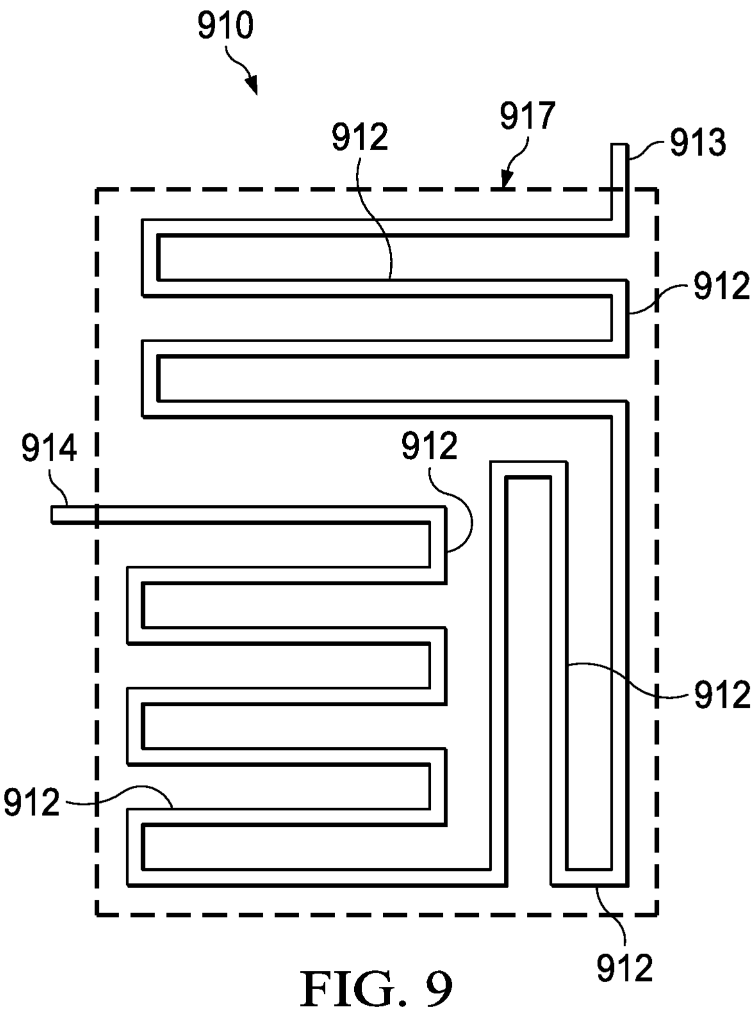
FIG. 9 illustrates a tether according to described examples.

FIG. 9 illustrates a tether according to described examples. Referring to FIG. 9, a tether 910 includes multiple beams 912, and a first end 913 and a second end 914. The tether 910 may meander between the first end 913 and the second end 914. In one example, the beams 912 of the tether 910 occupy or define approximately a rectangle region 917. The beams 912 may be shaped and sized to meander between the first end 913 and the second end 914, so as to have, e.g., a suitable spring constant according to application scenarios.

Referring to FIG. 2, the trench 130 is around at least a part of a periphery of the second portion 117 on which the MEMS structure 120 is formed. The trench 130 extends from the second surface 115 towards the first surface 114. As an example, the trench 130 may extend along the Z-axis and from the second surface 115, and penetrate through the second silicon layer 113 to reach a plane of the insulator layer 112.

As an example, the second portion 117 may be cantilevered from the first portion 116 with the connecting structure 118 therebetween, and an orthogonal projection of the trench 130 on the second surface 115 may have a C shape. FIG. 2 shows an example having one connecting structure 118, but any suitable number of the connecting structures may be provided in other examples, for example, 1, 2, 3, 4, or another suitable number. The shapes of the trenches may be chosen according to various application scenarios. The trench shape may include a C shape, a square-bracket shape, a double-L shape, or any other suitable shape. For the square-bracket shape, two trenches may be separated by two connecting structures, and orthogonal projections of the two trenches on the second surface 115 may include two square brackets. For the double-L shape, two trenches may be separated by two connecting structures, and orthogonal projections of the two trenches on the second surface 115 may include two L shapes.

Figure 3:
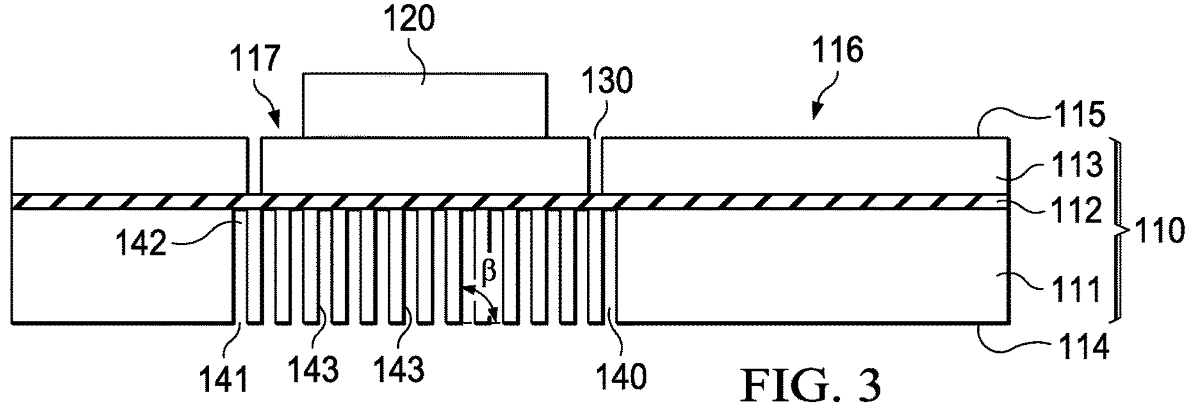
FIG. 3 illustrates a cross-sectional view of structures at another example stage of forming a device having stress and thermal isolation for a MEMS structure according to described examples.

Referring to FIG. 3, the formation method further includes forming pinholes 140 in the first silicon layer 111 (S804 in FIG. 8). The pinholes extends from the first surface 114 to the insulator layer 112. The pinholes 140 thus are formed on a side of the insulator layer 112 opposite the side facing the MEMS structure 120 and the second portion 117 of the second silicon layer 113. The pinholes 140 may be formed by etching. For example, deep reactive-ion etching (DRIE) may be performed to remove silicon in the first silicon layer 111 to form the pinholes 140. Each pinhole 140 has a first end 141, a second end 142, and an inner sidewall 143. The inner sidewall 143 may form an angle β with respect to the first surface 114.

Figure 4A:
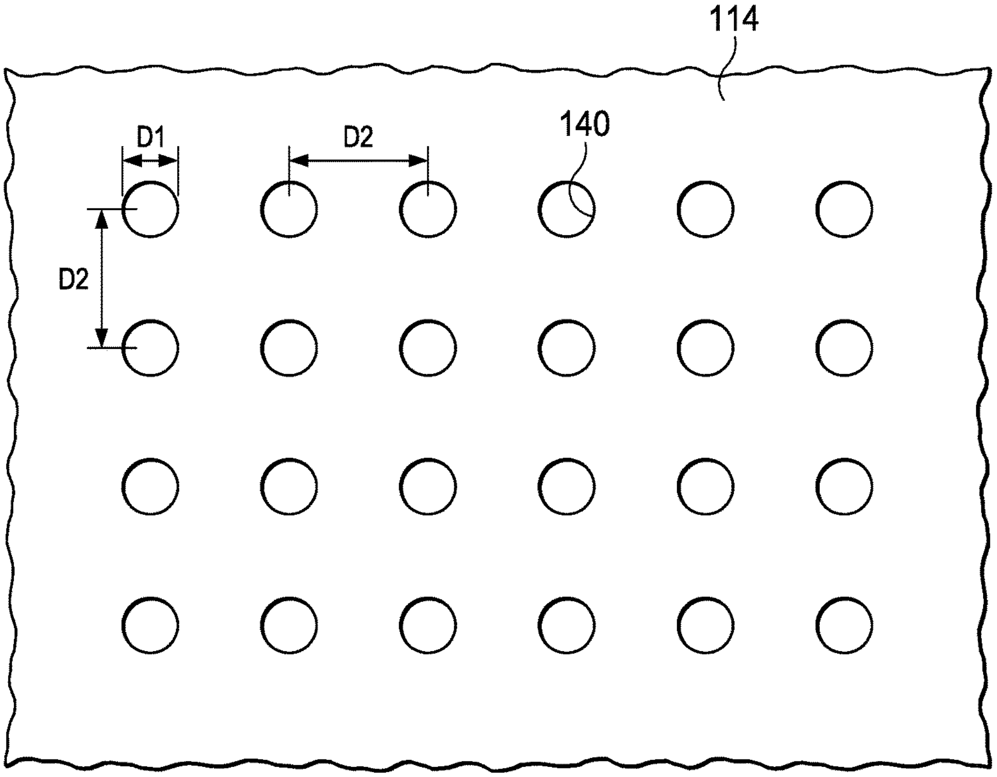
FIG. 4A illustrates an example arrangement of pinholes according to described examples.

Referring to FIG. 4A, the pinholes 140 are arranged in a square array. An in-plane hole dimension D1 of each pinhole 140 is a hole dimension in a plane parallel to the first surface 114 and the second surface 115. In the example of FIG. 4A, an orthogonal projection of the pinhole 140 on the first surface 114 is a circle (i.e., the pinholes are generally circular in cross-section across the X-Y plane shown in FIG. 1), and, accordingly, the in-plane hole dimension D1 is a diameter of the circle or a diameter of the pinhole 140. In the example of FIG. 4A, the pinholes are formed as an array and adjacent pinholes 140 are separate by distance D2 (pitch). In another example, the pitch between adjacent pinholes may vary across the array of pinholes—accordingly, some adjacent pinholes may be closer together and other adjacent pinholes.

For example, the diameter of each pinhole 140 may be in a range of 0.5 to 5 μm. A distance between adjacent pinholes may be, for example, in a range of 5 to 20 μm. A number of pinholes may be, for example, in a range of 25 to 2,500 pinholes.

Figure 4B:
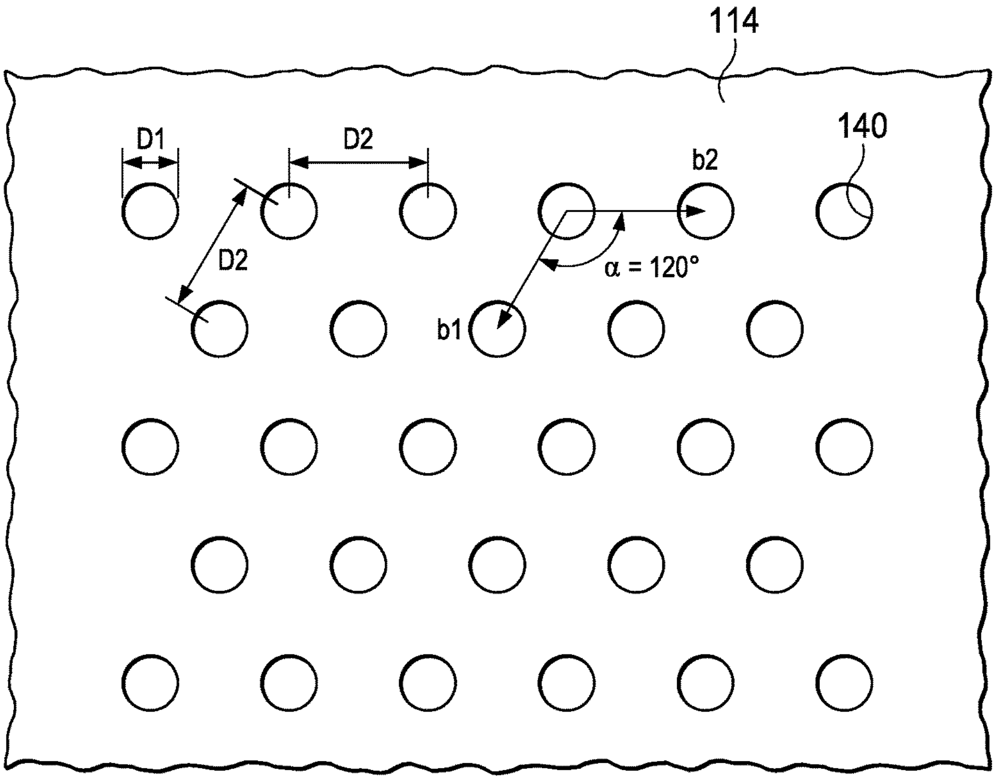
FIG. 4B illustrates another example arrangement of pinholes according to described examples.

Referring to FIG. 4B, the pinholes 140 are arranged in a hexagonal array. An in-plane hole dimension D1 of each pinhole 140 is a hole dimension in a plane parallel to the first surface 114 and the second surface 115. In the example of FIG. 4B, an orthogonal projection of the pinhole 140 on the first surface 114 is a circle (i.e., the pinholes are generally circular in cross-section across the X-Y plane shown in FIG. 1), and, accordingly, the in-plane hole dimension D1 is a diameter of the circle or a diameter of the pinhole 140. In the example of FIG. 4B, the pinholes are formed as a hexagonal array and adjacent pinholes 140 are separate by distance D2 (pitch). An angle α between two array directions b1 and b2 is 120 degrees. In another example, the pitch between adjacent pinholes may vary across the array of pinholes—accordingly, some adjacent pinholes may be closer together and other adjacent pinholes.

As noted above, pinholes 140 in FIG. 3 are approximately circular in cross-section across the X-Y plane shown in FIG. 1. As another example, an orthogonal projection of the pinhole 140 on the first surface 114 may be an ellipse, and an in-plane hole dimension D1 may be an average of dimensions of a major axis and a minor axis of the ellipse—or D1 may be the major or minor axis dimension.

Various shapes and arrangements of the pinholes may be chosen according to actual application scenarios. Orthogonal projections of the pinholes 140 on the first surface 114 may include a circle, an ellipse, a square, a rectangle, a triangle, or any combination thereof. For example, the shapes of the pinholes 140 may be circular in cross-section and with varying diameters (i.e., the diameters of some pinholes are larger than the diameters of other pinholes). The angles β of the inner sidewalls 143 of the pinholes 140 with respect to the first surface 114 may have various values. The angle β of the inner sidewall 143 may be approximately 90 degrees, less than 90 degrees such as approximately 70 degrees or 80 degrees, or having any other suitable value. In one example, the angle β of the inner sidewall 143 is less than 90 degrees, and the pinhole 140 has a shape of conical frustum, e.g., a shape of a portion of a cone. In another example, the angle β of the inner sidewall 143 is less than 90 degrees, and the pinhole 140 has a shape of pyramidal frustum, e.g., a shape of a portion of a pyramid.

The pinholes 140 may be arranged in a rectangular array (such as that shown in FIG. 4A), a hexagonal array (such as that shown in FIG. 4B), or any other suitable arrangement of pinholes. The pinholes 140 may have a random placement, without following an arrangement rule such as an array.

Figure 5:
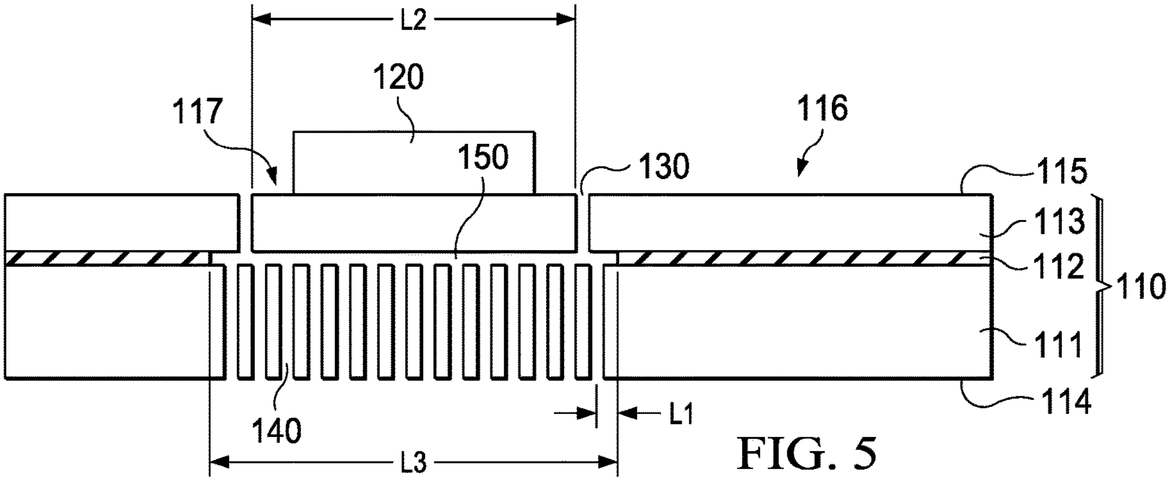
FIG. 5 illustrates a cross-sectional view of structures at another example stage of forming a device having stress and thermal isolation for a MEMS structure according to described examples.

Referring to FIG. 5, the formation method further includes forming an undercut 150 between the first silicon layer 111 and the second portion 117 of the second silicon layer 113 (S805 in FIG. 8). The undercut 150 is formed in the insulator layer 112. The undercut 150 may be formed by introducing an etching agent via the pinholes 140 to remove a portion of the insulator layer 112. The etching agent may include, for example, vapor hydrogen fluoride (HF) and/or hydrofluoric acid.

The undercut 150 separates the second portion 117 of the second silicon layer 113 and the MEMS structure 120 from the first silicon layer 111, and accordingly enhances stress and thermal isolation between the MEMS structure 120 and the first silicon layer 111. The undercut 150, and pinholes 140, and the trench 130 are connected and in fluid communication. The second portion 117 of the second silicon layer 113 and the MEMS structure 120 are separated from the SOI substrate 110 by the undercut 150 and the trench 130, but may be connected to the first portion 116 of the second silicon layer 113 via the connecting structure 118 (See FIGS.

1 and 5). The connecting structure 118 may support the second portion 117 of the second silicon layer 113 and the MEMS structure 120, and the undercut 150 and the trench 130 may reduce stress and heat in the second portion 117 of the second silicon layer 113 and the MEMS structure 120 due to contact with the SOI substrate 110 by reducing contact areas therebetween.

An in-plane dimension L3 of the undercut 150 is greater than an in-plane dimension L2 of the second portion 117 of the second silicon layer 113; and the undercut 150 separates the surface of the second portion 117 of the second silicon layer 113 from the first silicon layer 111. Further, the undercut 150 may extend along the X and Y-axes in the plane of the insulator layer 112.

By introducing an etching agent via the pinholes 140 to etch away a portion of the insulator layer 112 to form the undercut 150, the formation of the undercut 150 may be tuned by the pinholes 140, e.g., distances between adjacent pinholes 140, and/or dimensions of the pinholes 140. For example, as the pinholes 140 are arranged over the area of the undercut 150, etching of the portion of the insulator layer corresponding to the undercut 150 may be relatively uniform by introducing the etching agent via the pinholes 140 as compared to introducing the etching agent via, e.g., the trench 130.

At the point that the second portion 117 of the second silicon layer 113 is released from the first silicon layer 111 (by etching trench 130 and undercut 150), a distance L1 by which the undercut 150 extends from a pinhole 140 near or at an edge region of the second portion 117 of the second silicon layer 113 and extends outside the region of the pinholes 140 is less than half of the in-plane dimension L2 of the second portion 117 of the second silicon layer 113. Accordingly, $L1<(0.5*L2)$.

The distance L1 may be, for example, the same as or similar to the distance D2 between adjacent pinholes 140. For example, the distance L1 may be in a range of approximately 0.5*D2 to D2. As another example, the distance L1 may be equal to approximately $D2\cdot\sqrt{2}/2$. The distance L1 may be controlled by pinhole pitches and sizes. The distance D2 between adjacent pinholes 140 may be chosen to be less than the in-plane dimension L2 of the second portion 117 of the second silicon layer 113, and accordingly the distance L1 may be less than the in-plane dimension L2 of the second portion 117. For example, the distance D2 between adjacent pinholes 140 may be chosen to be (1/N)*L2, where N is a positive value greater than 1, such as 2, 3, 4, 5, 5.3, or 6.2; and accordingly the distance L1 may be equal to or less than (1/N)*L2. In a more specific example, the distance D2 between adjacent pinholes 140 may be chosen to be (1/10)*L2, and the distance L1 may be equal to or less than 0.1*L2.

Figure 6:
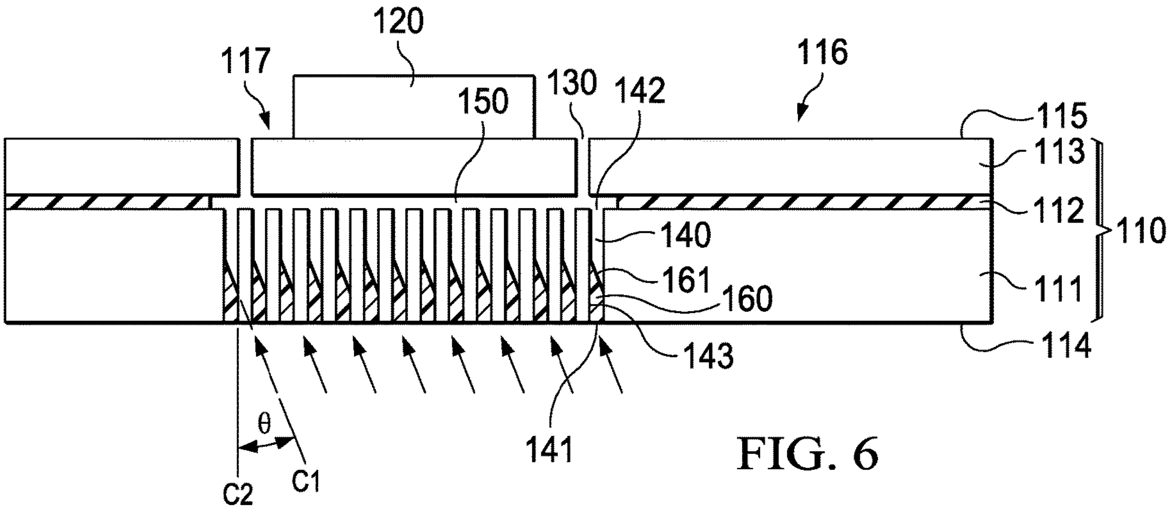
FIG. 6 illustrates a cross-sectional view of structures at another example stage of forming a device having stress and thermal isolation for a MEMS structure according to described examples.

Referring to FIG. 6, the formation method further includes forming seals 160 to cover the pinholes 140 (S806 in FIG. 8). The seal 160 is formed at the first end 141 of the pinhole 140, as shown in FIG. 6. The pinhole 140 may be, for example partially filled by the seal 160 in FIG. 6. The seal 160 may extend towards the second end 142 of the pinhole 140.

As an example, each seal 160 may include a laminate film seal. As another example, each seal 160 may include a silicon (or other suitable material) seal deposited using physical vapor deposition (PVD) or chemical vapor deposition (CVD), e.g., plasma-enhanced chemical vapor deposition (PECVD).

The deposition of the seal may be performed, for example, by an angled deposition, in which a deposition direction C1 is, as indicated by the arrows in FIG. 6, tilted at an angle θ with respect to a normal line C2 of the SOI substrate 110, i.e., a line perpendicular to the SOI substrate 110. For example, θ may be in the range of 0 to 45 degrees. The seal 160 may include, for example, a tilted surface 161 inside the pinhole 140. The tilted surface is tilted with respect to the first surface 114. By the angled deposition, the deposition direction is oriented toward an inner sidewall 143 of the pinhole 140. Accordingly, the angled deposition may help seal the first ends 141 of the pinholes 140 without filling up the entire pinholes and the undercut 150.

Figure 7:
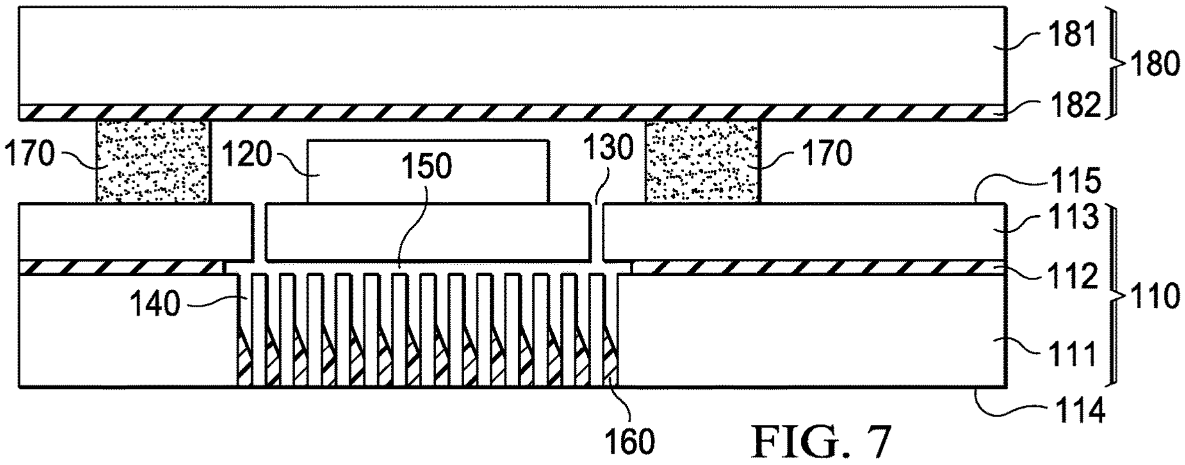
FIG. 7 illustrates a device having stress and thermal isolation for a MEMS structure according to described examples.

The MEMS structure illustrated in FIGS. 1-6 is formed on an SOI substrate 110, which is a wafer. Accordingly, multiple such MEMS structures and associated pinholes 140 are formed across the SOI wafer. FIG. 7 illustrates wafer-level encapsulation in which a cap wafer 180 is attached to the SOI substrate 110 through use of bonding agents 170 (S807 in FIG. 8). The bonding agents 170 may include an organic material. As another example, the bonding agents 170 may include an inorganic material, such as silicon oxide. The cap wafer 180 may include, for example, a silicon layer 181 and an oxide layer 182 such as a silicon oxide layer. The bonding agents 170 may be formed by patterning and etching. Through application of heat to the bonding agents, the cap wafer 180 is adhered to the SOI substrate 110.

The wafer-level encapsulation may be performed after or before forming the pinholes 140 and the undercut 150. For example, the cap wafer 180 may be attached to the SOI substrate after the MEMS structure 120 is formed but before the pinholes 140 and the undercut 150 are formed in order to protect the MEMS structure 120 during the process of forming the pinholes 140 and undercut 150. Alternatively, the pinholes 140, undercut 150, and pinhole sealing may be performed followed by wafer-level encapsulation using the cap wafer 180.

Modifications are possible in the described embodiments, and other embodiments are possible, within the scope of the claims.

What is claimed is:

1. A device, comprising:

a substrate having a first layer, a second layer, and an insulator layer between the first layer and the second layer;

a microelectromechanical system (MEMS) structure on a portion of the second layer;

a first trench in the second layer and around at least a part of a periphery of the portion of the second layer;

an undercut in the insulator layer and adjacent to the portion of the second layer, separating the portion of the second layer from the first layer;

second trenches extending through the first layer and connected to the undercut; and a material in the second trenches and sealing ends of the second trenches opposing the undercut, the material including at least one of a laminate film or silicon, wherein the material in each second trench of the second trenches has an inner surface that tilts from one side of a sidewall of the second trench to an opposing side of the sidewall.

2. The device of claim 1, wherein the inner surface is tilted at an angle between 0-45 degrees with respect to the sidewall of the second trench.

3. The device of claim 1, wherein orthogonal projections of the first and second trenches on a plane of the insulator layer include a circle, an ellipse, a square, a rectangle, a triangle, or any combination thereof.

4. The device of claim 1, wherein an orthogonal projection of each second trench of the second trenches on a plane of the insulator layer includes a circle.

5. The device of claim 1, wherein the second trenches are arranged on a square array.

6. The device of claim 1, wherein the second trenches have different diameters.

7. The device of claim 1, wherein:

a number of the second trenches is in a range of 25 to 2500;

each of the second trenches has a diameter in a range of 0.5 to 5 μm; and a distance between adjacent ones of the second trenches is in a range of 5 to 20 μm.

8. The device of claim 1, wherein:

the portion of the second layer is a first portion of the second layer, and the first portion of the second layer is cantilevered from a second portion of the second layer via a connecting structure.

9. The device of claim 1, wherein:

the portion of the second layer is a first portion of the second layer, and the first portion of the second layer is connected to and supported by a second portion of the second layer via two connecting structures.

10. The device of claim 1, further comprising a cap over the MEMS structure and attached to the second layer.

11. The device of claim 1, wherein the MEMS structure comprises a bulk acoustic wave resonator.

12. The device of claim 1, wherein:

the undercut separates a surface of the portion of the second layer from the first layer.

13. The device of claim 1, wherein the substrate and the material include silicon.

14. A device, comprising:

a substrate having a first layer opposite a second layer and an insulator layer between the first layer and the second layer; and a microelectromechanical system (MEMS) structure on the first layer of the substrate;

a first trench in the substrate around at least a portion of the substrate and extending from the first layer towards the second layer, the portion of the substrate having the MEMS structure thereon;

an undercut in the insulator layer;

second trenches extending through the second layer and connected to the undercut; and a material in the second trenches and sealing ends of the second trenches opposing the undercut, the material including at least one of a laminate film or silicon, wherein the material in each second trench of the second trenches has an inner surface that tilts from one side of a sidewall of the second trench to an opposing side of the sidewall.

15. The device of claim 14, wherein:

the portion of the substrate is a first portion of the substrate; and the MEMS structure is on the first portion of the substrate, the first portion being cantilevered from a second portion of the first layer.

16. The device of claim 14, further comprising a cap over the MEMS structure and attached to the first layer.

17. The device of claim 14, wherein the substrate and the material include silicon.

18. The device of claim 14, wherein the inner surface is tilted at an angle between 0-45 degrees with respect to the sidewall of the second trench.

19. A device comprising:

a first semiconductor layer including first trenches, at least parts of the first trenches filled with a sealant material including at least one of a laminate film or silicon, wherein the sealant material in each first trench of the first trenches has an inner surface that tilts from one side of a sidewall of the first trench to an opposing side of the sidewall of the first trench;

an insulator layer on at least a first portion of the first semiconductor layer; and a second semiconductor layer on the insulator layer, a second trench at least partially around a region of the second semiconductor layer, a gap between the region of the second semiconductor layer and the first semiconductor layer and connected to the first trenches and the second trench.

20. The device of claim 19, wherein at least one first trench of the first trenches extends past the insulator layer.

21. The device of claim 19, wherein the region of the second semiconductor layer is a first region of the second semiconductor layer, a second region of the second semiconductor layer being outside the second trench, a tether coupling the first region of the second semiconductor layer to the second region of the second semiconductor layer, the tether having a first end adjacent the first region of the second semiconductor layer and a second end adjacent the second region of the second semiconductor layer, and the tether meandering between the first end and the second end.

22. The device of claim 19, wherein the inner surface is tilted at an angle between 0-45 degrees with respect to the sidewall of the second trench.

* * * * *